(12) United States Patent
Yen et al.

(10) Patent No.: US 7,196,429 B2
(45) Date of Patent: Mar. 27, 2007

(54) METHOD OF REDUCING FILM STRESS ON OVERLAY MARK

(75) Inventors: Yu-Lin Yen, Hsinchu (TW); Ching-Yu Chang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 225 days.

(21) Appl. No.: 10/833,206

(22) Filed: Apr. 26, 2004

(65) Prior Publication Data

US 2005/0236721 A1    Oct. 27, 2005

(51) Int. Cl.
*H01L 21/76* (2006.01)
*H01L 23/544* (2006.01)

(52) U.S. Cl. .................. 257/797; 438/401; 438/975
(58) Field of Classification Search ............... 257/797, 257/767; 438/401, 462, 975
See application file for complete search history.

(56) References Cited

U.S. PATENT DOCUMENTS

| | | | | |
|---|---|---|---|---|
| 5,640,053 A | * | 6/1997 | Caldwell | 257/797 |
| 6,288,454 B1 | * | 9/2001 | Allman et al. | 257/797 |
| 6,383,910 B2 | * | 5/2002 | Okada et al. | 438/622 |
| 6,596,604 B1 | * | 7/2003 | Lojek et al. | 438/401 |
| 6,774,452 B1 | * | 8/2004 | Ramkumar et al. | 257/506 |
| 6,801,313 B1 | * | 10/2004 | Yokota | 356/401 |
| 6,809,420 B1 | * | 10/2004 | Wong | 257/773 |
| 6,858,441 B2 | * | 2/2005 | Nuetzel et al. | 438/3 |
| 6,979,526 B2 | * | 12/2005 | Ning | 430/314 |
| 2002/0016059 A1 | * | 2/2002 | Okada et al. | 438/622 |
| 2002/0081501 A1 | * | 6/2002 | Hasegawa et al. | 430/5 |
| 2003/0036021 A1 | * | 2/2003 | Khan et al. | 430/313 |
| 2005/0195398 A1 | * | 9/2005 | Adel et al. | 356/401 |

* cited by examiner

*Primary Examiner*—Tuan H. Nguyen
(74) *Attorney, Agent, or Firm*—Stout, Uxa, Buyan & Mullins, LLP

(57) ABSTRACT

An integrated circuit capable of operating despite a profile shift is disclosed. Overlay marks on the integrated circuit are surrounded by a trench that tends to relieve the effect of a profile shift caused by stress applied to the integrated circuit. The position of the overlay marks tends, therefore, not to be affected by the stress.

12 Claims, 6 Drawing Sheets

METHOD OF REDUCING FILM STRESS ON OVERLAY MARK

BACKGROUND OF THE INVENTION

1. Field of the Invention

The present invention relates generally to integrated circuit fabrication methods and, more particularly, to providing an integrated circuit capable of operating within predetermined parameters despite a profile shift.

2. Description of Related Art

Fabrication processes for semiconductor devices and integrated circuitry have traditionally included depositing or epitaxially growing layers on a substrate. Layers are patterned through photolithographic processes before additional layers are deposited or grown. A photolithographic process can include depositing a photoresist on top of a layer, positioning a reticle mask (containing a pattern of opaque lines and regions on an otherwise transparent material) over the photoresist, and shining coherent or noncoherent light through the reticle mask onto the photoresist. The light cures the photoresist only where the photoresist is not shadowed by the reticle mask pattern. Any cured photoresist (e.g., the photoresist exposed by the reticle mask pattern) is then washed away, exposing regions of the uppermost layer to subsequent processes such as oxidation, metal deposition, and/or impurity doping. Finally, any uncured photoresist is then stripped away, and another photolithography process may begin with another material.

An industry trend toward smaller devices has exacerbated a need to align the subsequent reticle masks more precisely with the previous photolithographic step. If, for example, a semiconductor-layer step creates a transistor and then a subsequent metal-layer step is not aligned precisely, a vital connection between the transistor and a conductive path may not be formed.

To facilitate alignment, many fabrication steps include creation of a vernier pattern, overlay marks, or other alignment marks on both a reticle mask and the layer to which the reticle mask is to be aligned. Such alignment marks are not necessary for operation of the integrated circuit, but can allow improved alignment of the reticle masks with the substrate.

In some processes, to flow deposited materials, such as metal melts, onto the substrate, heating (e.g., annealing) is implemented. Heating upper layers can unfortunately cause a flexing of the substrate resulting in a profile shift, since different layers on the substrate are made of different materials with different rates of thermal expansion. The distances between verniers and/or alignment marks (particularly those near the periphery of the substrate) might change relative to other features in the layer. Also, the heating of upper layers might reflow or soften lower layers, allowing one edge of an overlay mark or alignment mark to dip more than another edge, perhaps changing an angle of the upper surface of the overlay mark or alignment mark with respect to other features on the layer.

SUMMARY OF THE INVENTION

In accordance with one aspect of the present invention, at least one of the above shortcomings is addressed by a method that provides a trench around an overlay mark. The trench can allow the overlay mark to remain in a proper relationship with respect to other features in the layer despite thermally-induced flexing of the substrate. An overlay mark near a periphery of a substrate (i.e., an outer overlay mark), can reflect a real or proper overlay condition in response to a reticle mask being aligned with the substrate.

An embodiment of the present invention comprises an integrated circuit structure comprising a first layer that comprises a first overlay mark. A trench surrounds the first overlay mark. This embodiment further comprises a second layer having a second layer feature within the trench. A third layer is disposed over the first layer and the second layer, the third layer being aligned with the first overlay mark. This embodiment further comprises a second overlay mark. The first overlay mark in this embodiment is disposed at a first distance from the second overlay mark, and the trench is disposed at a second distance from the second overlay mark. Although the second distance may change substantially in response to a profile shift, the first distance tends to change little in response to the profile shift. Further, the third layer remains in physical and electrical contact with the second layer feature despite the profile shift.

The invention herein disclosed can allow and facilitate improved alignment of a reticle mask with a substrate by allowing a process engineer to determine whether the reticle mask "overlays" the substrate by reflecting a real or proper overlay condition of a reticle mask with a substrate. The reticle mask overlays the substrate when the reticle mask is positioned properly with respect to the substrate. A trench in accordance with the present invention can reduce a stress effect of a deposited film with respect to the vernier, as the deposited film moves with temperature. The trench can be formed in various shapes around the vernier with relative ease.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1A:
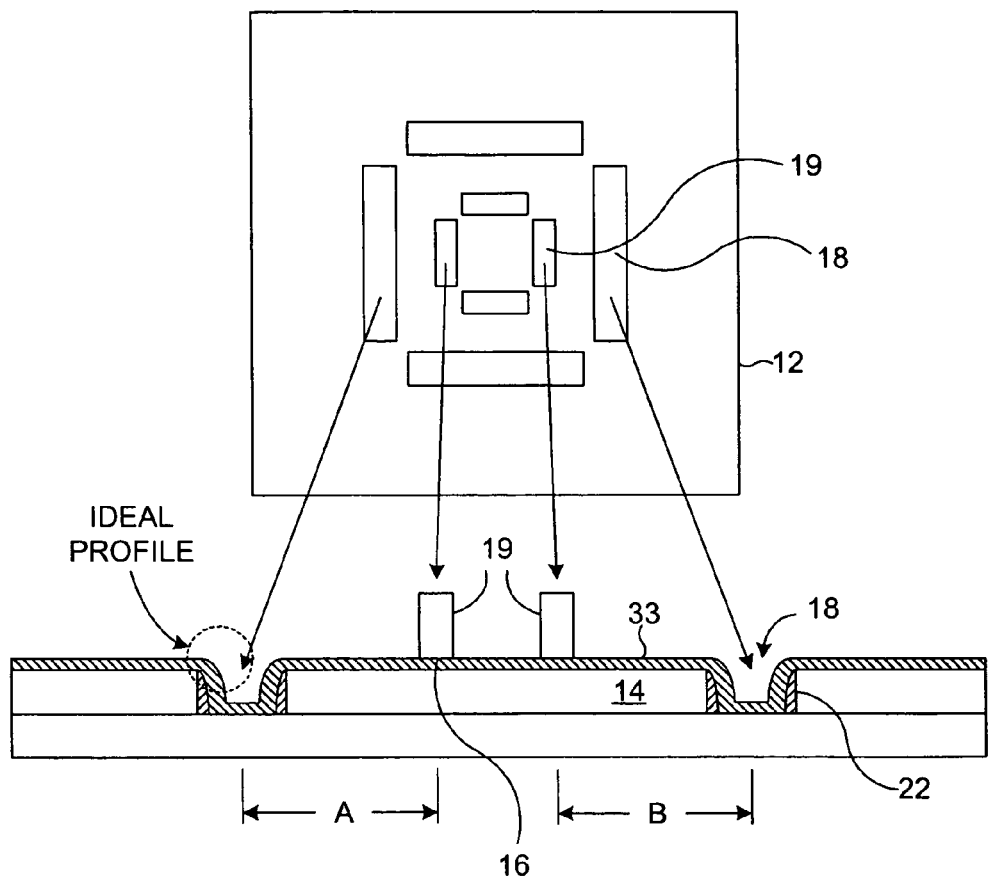
FIG. 1A is a plan and cross-sectional view of a prior art alignment structure.

Reference will now be made in detail to the presently preferred embodiments of the invention, examples of which are illustrated in the accompanying drawings. Wherever possible, the same or similar reference numbers are used in the drawings and in the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of alignment structures. The present invention may be practiced in conjunction with various integrated circuit fabrication techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to integrated circuit devices and methods of etching layers disposed on substrates of such devices.

FIG. 1A is a plan and cross-sectional view of a prior-art alignment structure 12, normally in a peripheral or scribe line region of an integrated circuit structure. Note that the scales of the plan views and the cross-sectional views in FIGS. 1A, 1B, 2, 4, and 5 are different. The alignment structure 12 includes a first layer 14, which, as presently embodied, comprises a first material such as an inter-layer dielectric (ILD). The illustrated structure further comprises a first overlay mark 18 formed in the first layer 14. A feature of a second layer 22 is located within the first overlay mark 18, and a third layer 33 overlies the first layer 14 and the feature of the second layer 22. A second overlay mark 16 defined by a photoresist 19 overlies the third layer 33. A feature of the third layer 33 may be located within the first overlay mark 18.

Figure 1B:
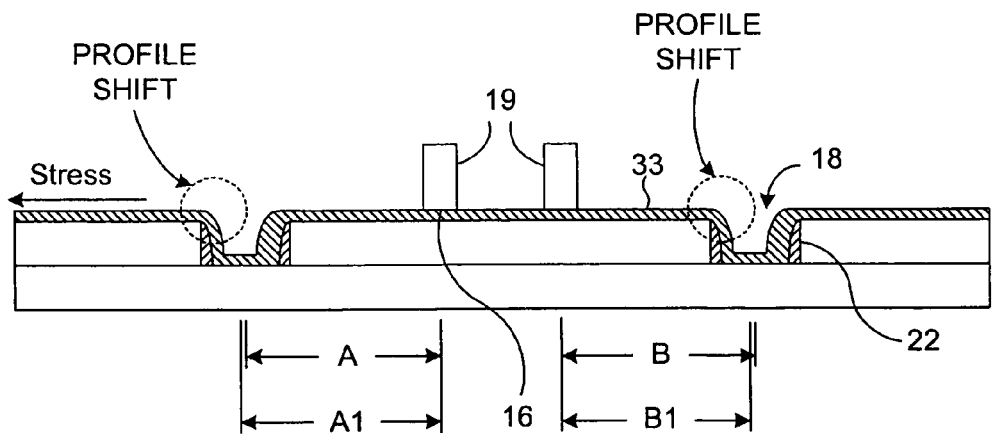
FIG. 1B is a cross-sectional diagram of the prior art structure of FIG. 1A that has been subjected to stress.

FIG. 1B is a cross-sectional diagram of the prior-art structure of FIG. 1A that has been subjected to stress. In an ideal, unstressed condition, the center of a first overlay mark 18 lies at a distance A from the center of a second overlay mark 16, and the center of another first overlay mark 18 lies at a distance B from the center of another second overlay mark 16. Not all of the first overlay marks 18 and second overlay marks 16 in FIGS. 1, 2, 4, 5, 6A and 6B are identified by reference designators in order to avoid complicating the figures.

Under a stress condition, the stress may cause an edge profile shift that changes the distance A to A1 and the distance B to B1. The edge profile shift can create false readings, making it difficult to ascertain actual alignment conditions.

Figure 2:
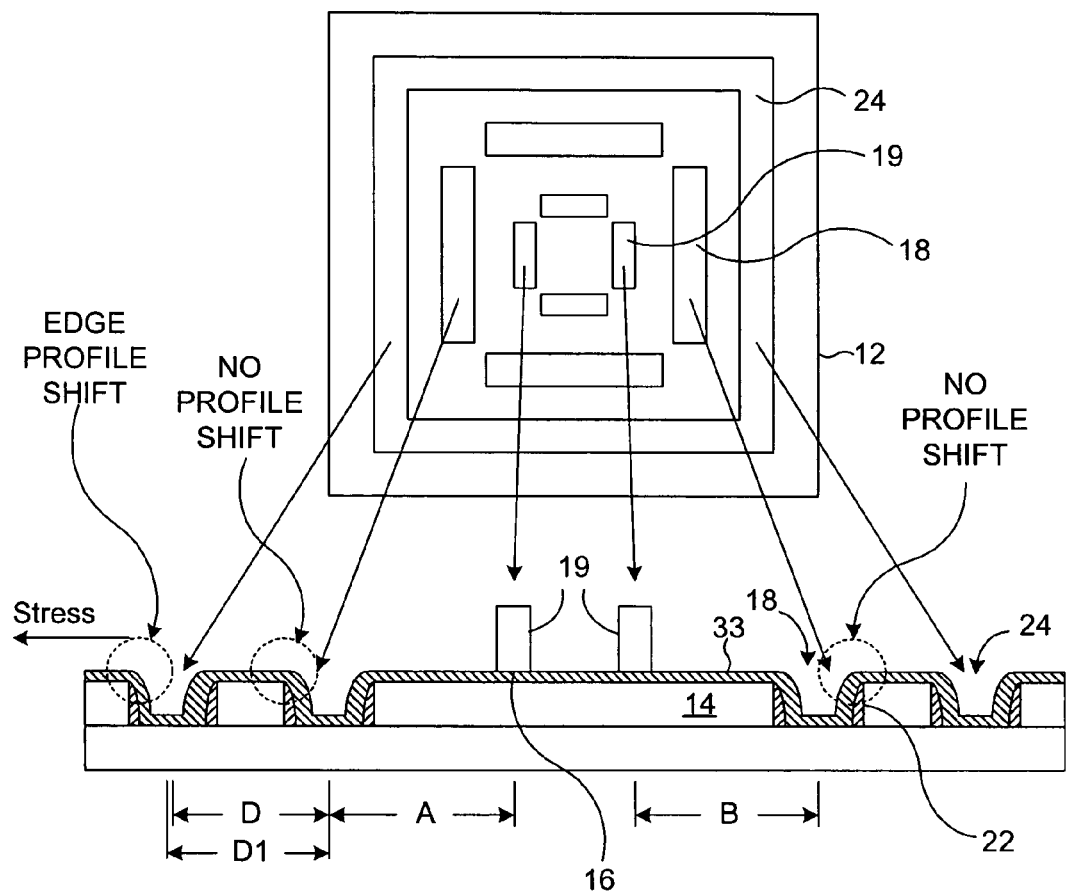
FIG. 2 is a plan and cross-sectional view of an alignment structure formed in accordance with an exemplary embodiment of the present invention.

FIG. 2 is a plan and cross-sectional view of an alignment structure 12 formed in accordance with an exemplary embodiment of the present invention. This structure differs from the prior art structure illustrated in FIG. 1A by the inclusion of a trench 24 that surrounds at least a portion of the first overlay mark 18. Four first overlay marks 18 are shown in the illustrated embodiment, and in the illustrated embodiment the trench 24 is disposed at a distance D from the first overlay marks 18. Stress applied to the integrated circuit may deform the trench 24, changing the distance D to D1 in the illustrated embodiment. However, the trench 24 tends to absorb the stress, thereby reducing or eliminating the effect of stress on the first overlay mark 18 so that the distance A is substantially unchanged. The process by which the various layers and features can be formed in the illustrated structure is more particularly described in the description that follows.

Figure 3:
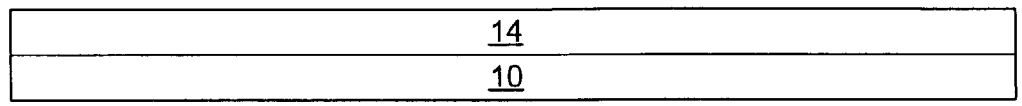
FIG. 3 is a cross-sectional diagram that illustrates a first layer, comprising an inter-layer dielectric, deposited or grown on an underlying layer.

FIGS. 3–6 show an implementation of representative stages of producing the alignment structure of FIG. 2. FIG. 3 is a cross-sectional diagram that illustrates a first layer 14, comprising an inter-layer dielectric deposited or grown on an underlying layer 10. The first layer 14 may comprise an inter-layer dielectric such as tetraethylorthosilicate (TEOS), borophosphosilicate glass (BPSG), or a TEOS and BPSG complex, and may be deposited or grown on the substrate in accordance with an exemplary embodiment of the present invention. According to a representative embodiment, the underlying layer 10 is a substrate formed of silicon. Inter-layer dielectrics are used between metal layers, such as an underlying layer 10 and a second layer, to prevent inter-layer shorts. It should be appreciated that many integrated circuits, such as microprocessors and other devices commonly manufactured in the computer industry, can have six or more metal layers separated from one another by inter-layer dielectrics. In modified embodiments, first layer 14 may be a thick native silicon-dioxide layer that has been epitaxially grown directly on an amorphous silicon substrate and then planarized. The amorphous silicon substrate may have been doped to create semiconductor devices such as transistors and diodes. In modified embodiments, the first layer 14 can be any suitable dielectric or other insulator.

Figure 4:
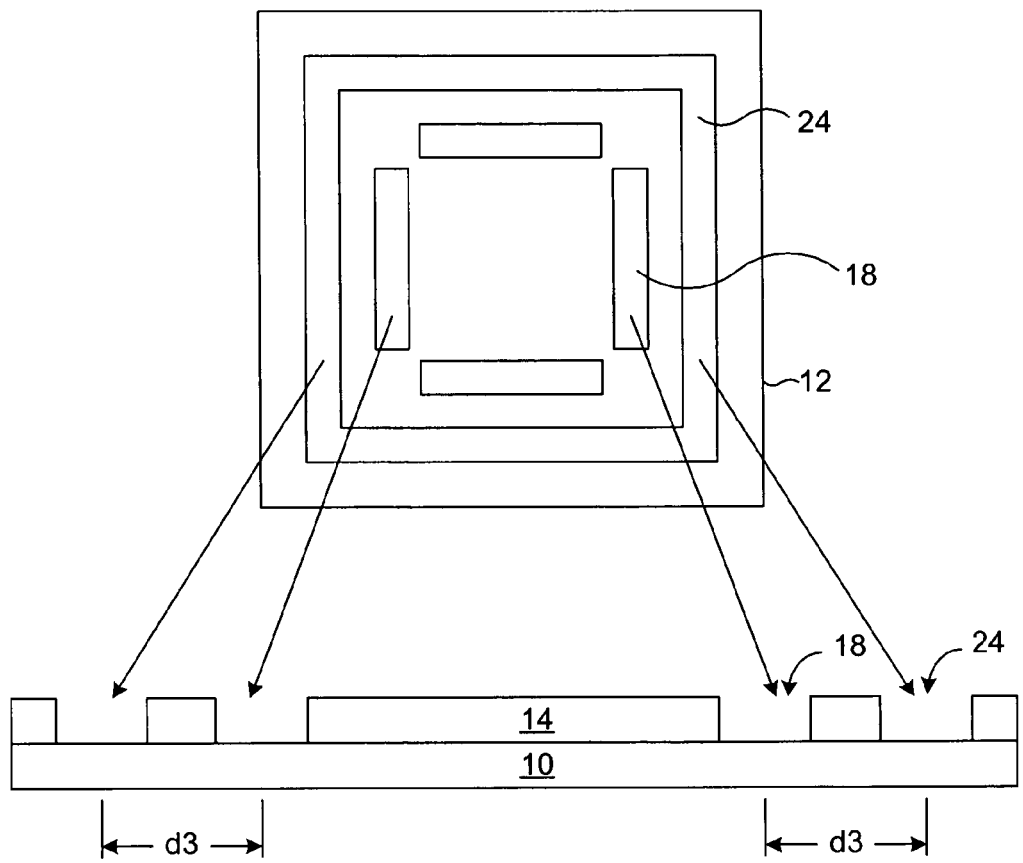
FIG. 4 is a plan and cross-sectional view of the structure of FIG. 3 after the first layer has been patterned to create an overlay mark and a trench using a photolithographic technique.

FIG. 4 is a plan and cross-sectional view of the structure of FIG. 3 after the first layer 14 has been patterned to create a first overlay mark 18 and a trench 24 using a photolithographic technique. The first overlay mark 18 and the trench 24 of the first layer 14 are formed, for example, by photolithographically etching an inter-layer dielectric. Photolithography and etching processes, which are well-understood in the art, are described below in the context of an exemplary embodiment in connection with the formation of the first overlay mark 18 and the trench 24 in the first layer 14. An exemplary photolithographic technique includes covering the first layer 14 with a photoresist, aligning a reticle mask substantially parallel with and at a predetermined distance above the substrate, and generating light or other radiation (such as deep ultraviolet light or laser emission) at a location such that only the light or other radiation that has passed through the reticle mask may reach the substrate. Thus, the reticle mask is positioned between the substrate and a source of the light or other radiation, so that the reticle mask prevents the light or other radiation from curing the photoresist in some regions and allows the light or other radiation to cure the photoresist in other regions. For positive photoresist, the light (or other radiation) cures the photoresist where exposed. Any cured portions of the photoresist are washed away, exposing the first layer 14 where the photoresist has not been cured. An etcher then removes portions of the first layer 14 where the photoresist has not been cured, leaving behind a first overlay mark 18 and a trench 24 around the first overlay mark 18.

Figure 5:
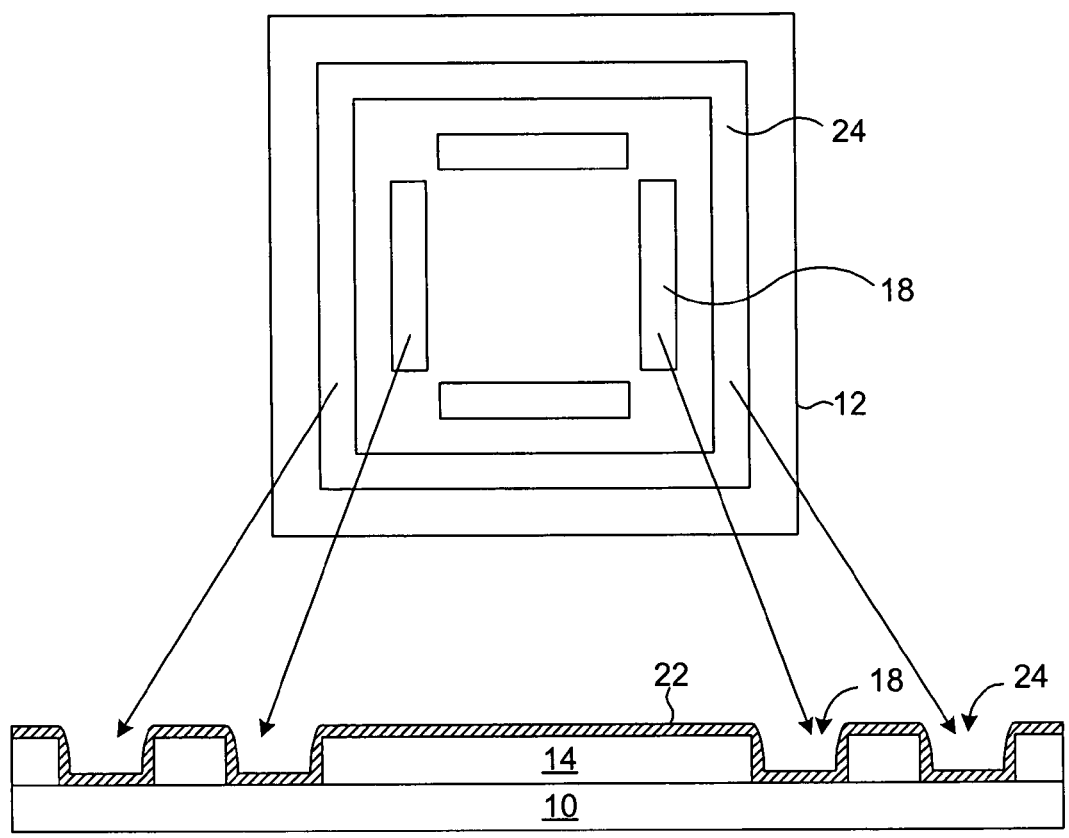
FIG. 5 is a plan and cross-sectional view of the structure of FIG. 4 after deposition of a second layer.

FIG. 5 is a plan and cross-sectional view of the structure of FIG. 4 after deposition of a second layer 22. The second layer 22 in the illustrated embodiment has a second-layer feature that is located within the first overlay mark 18 of the first layer 14. The second layer 22 is further disposed within the trench 24 which may form a second layer feature located within the trench 24. To create the second layer 22, the substrate can be covered with a second material. For purposes of illustration, the second layer 22 is described as comprising tungsten (W). It will, however, be appreciated that any metal or other electrical conductor, such as aluminum (Al) or copper (Cu), would function appropriately in accordance with the illustrated embodiment of the present invention. Sputtering or chemical-vapor deposition (CVD) can allow the tungsten to be deposited onto the substrate.

Figure 6A:
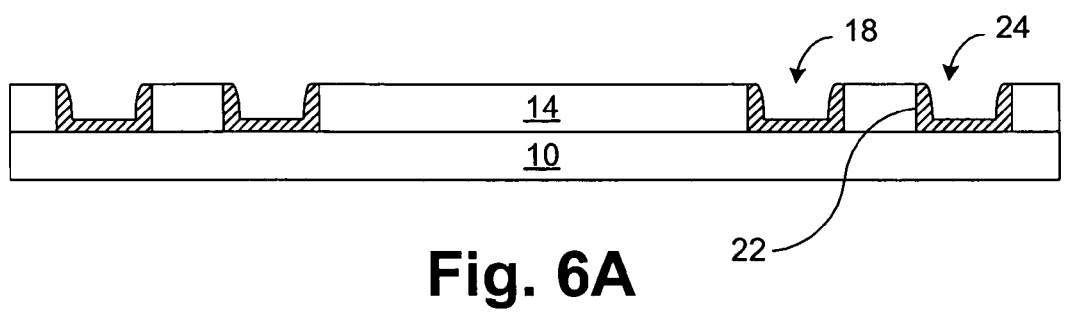
FIGS. 6A and 6B are cross-sectional views that illustrate the result of planarizing the second layer.
Figure 6B:
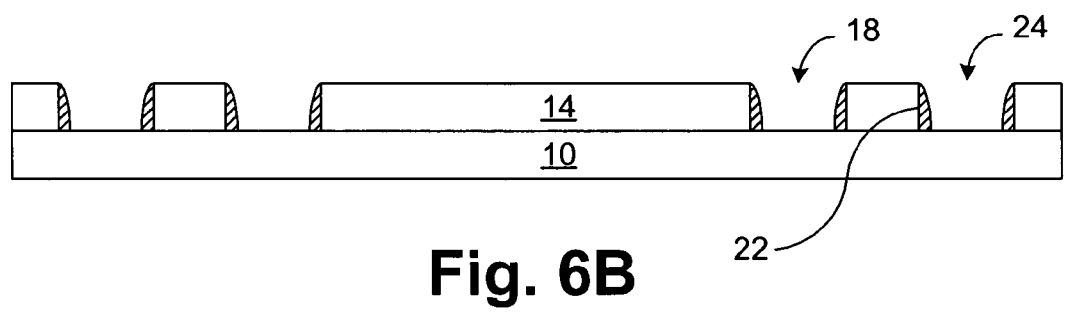

FIGS. 6A and 6B are cross-sectional views that illustrate the result of planarizing the second layer 22. The second layer 22, which, as already noted, may be formed of tungsten, can be planarized, for example, by chemical-mechanical polishing (CMP) illustrated in FIG. 6A or by etching back illustrated in FIG. 6B. After planarization, the first overlay mark 18 of the first layer 14 thus contains a second-layer feature formed of tungsten, or other metal, of the second layer 22. The following description assumes that the etching back process shown in FIG. 6B has been executed.

A subsequent mask stage may be performed. The subsequent mask stage may include removing a first reticle mask that was used to pattern the first layer 14.

A subsequent deposition stage includes forming a third layer 33 (FIG. 2) over the structure described above with reference to FIG. 6B. Prior to the formation of the third layer 33, a glue layer may be formed, wherein the glue layer comprises a Ti-nitride (TiN)/titanium (Ti) complex such as TiN/Ti or Ti/TiN/Ti. In the illustrated embodiment, additional conductive material such as metal is sputtered onto the substrate. For example, an aluminum layer may be sputtered onto the substrate. In a modified embodiment, copper, for example, may be used instead of aluminum. Typically, the third layer 33 includes a metal/TiN/Ti complex. At least some of the aluminum that is deposited falls into the first overlay mark 18 and forms a contact with the first layer 14 and the second layer 22. Some of the material of the third layer 33 further may fall into the trench 24. The aluminum that is located within the first overlay mark 18 may be referred to as a third layer feature. Another third layer feature may be located in the trench 24. In addition to removing the first reticle mask and depositing the aluminum layer, a subsequent mask stage may include patterning the aluminum layer using a subsequent reticle mask to generate conductive paths in, for example, a word-line direction.

The photolithographic techniques that are used to pattern the third layer 33 can be similar to the photolithographic techniques that are used to pattern the first layer 14, but may differ in specific wavelengths and use different reticle masks, etchers and photoresists.

In accordance with one aspect of the present invention the third layer 33 is coated with photoresist 19 that is then patterned, exposed, and developed to form a second overlay mark 16. Formation of the third layer 33 can create a stress condition that can change the position of the first overlay mark 18 relative to the second overlay mark 16. For example, distance A may be changed to A1, and distance B may be changed to B1 (FIG. 1) as already described. In the embodiment illustrated in FIG. 2, however, the trench 24 tends to absorb the stress so the distances A and B are substantially unchanged. Aligning the reticle mask used in patterning the second overlay mark 16 can ensure that features on subsequent layers are in physical and electrical contact or alignment with predetermined features of the substrate such as the features of the second layer 22.

Alignment with the second overlay mark 16 may be performed either manually or automatically. Manual alignment can entail use of a microscope through which an operator views both the reticle mask and the substrate. Either the reticle mask or the substrate is moved slightly, as necessary, in response to, for example, an overlay condition until the reticle mask target is positioned directly over the substrate target. Automatic alignment mechanisms can reflect an incident light beam from the substrate, wherein various sharp edges of the features on the substrate, particularly sharp edges of substrate targets, refract the reflected light. An automatic mechanism can interpret the refraction pattern and move the substrate slightly, as necessary, until the reticle mask target is positioned directly over the substrate target. Laser interferometers, for example, can allow a stepper to control movement of the reticle mask.

Heating or annealing of the substrate, for example, may cause the third layer 33 to undergo a profile shift. The profile shift may comprise, for example, flexing due to unequal thermal expansions of various components such as the first layer 14 and the third layer 33. The profile shift can undesirably move, for example, the third layer 33 or cause it to shift relative to the first layer 14.

Returning to FIG. 2, the trench 24 in the illustrated embodiment of the present invention can prevent or attenuate the third layer 33 from being substantially shifted away from the second overlay mark 16 or substantially shifted toward the second overlay mark 16. In other words, as a result of the trench 24, first overlay marks 18 tend to remain at distances A and B from the second overlay marks 16 and/or tend not to shift as much as they would if no trench 24 were present.

The method of fabricating an integrated circuit structure may include flexing the integrated circuit structure to provide the profile shift. Flexing the integrated circuit structure is not necessarily performed mechanically, may not always be desired, and may typically occur as a byproduct of certain steps. The step of flexing the integrated circuit structure may include heating the integrated circuit structure. When the integrated circuit structure is heated, it may expand and also flex due to different layers having different coefficients of thermal expansion. Flexing the integrated circuit structure can include a step of cooling the integrated circuit structure. When the integrated circuit structure is cooled, it may also flex due to different layers having different coefficients of thermal expansion. Such flexing of the integrated circuit structure may tend to produce a profile shift. The profile shift does not substantially change the distance A or B between the first overlay mark 18 and the second overlay mark 16. Even if the first layer 14 flexes slightly in response to the profile shift, the distance A or B remains substantially invariant.

As the third layer 33 may undergo metal stress, the third layer feature within the first overlay mark 18 will tend to undergo a minimal profile shift compared to that which would occur absent the trench 24. The aluminum (or other metal of the third layer 33) remains physically trapped within the first overlay mark 18, whose distance A or B from the second overlay mark 16 does not substantially change in response to the profile shift. The tendency for the third layer features to remain in physical contact with the first overlay mark 18 and the second layer features thus causes the third layer 33 to resist movement relative to the first layer 14 despite the profile shift.

With particular reference to FIG. 1B, the third layer 33 may undergo a profile shift as the substrate flexes slightly due to, for instance, differences among rates of thermal expansion of the various layers. The distance A or B between the third layer feature (within the first overlay mark 18) and the second overlay mark 16 can change somewhat in response to the profile shift, and in the illustrated embodiment the third layer feature within the overlay mark 18 is shown having shifted so that part of the third layer 33 that used to be at a midpoint of the first overlay mark 18 is now disposed at a distance A1 or B1 from the midpoint of the second overlay mark 16. However, in accordance with one aspect of the present invention, as illustrated in FIG. 2, the trench 24 tends to absorb the effect of the profile shift. As a result, a profile shift may leave the distance A or B between the third layer feature and the second overlay mark 16 substantially unchanged or may reduce the difference between A and A1 or B and B1. In some processes, to for example flow deposited materials, such as metal melts, onto the substrate, heating or annealing is implemented. Heating upper layers can unfortunately cause a flexing of the substrate, since different layers on the substrate are made of different materials with different rates of thermal expansion. The surfaces of the second overlay marks (particularly the second overlay marks near the periphery of the substrate) might no longer be precisely parallel with the surfaces of the other features in the layer. Also, the heating of upper layers might reflow or soften lower layers, allowing one edge of a second overlay mark 16 to dip more than another edge and changing an angle of the upper surface of the second overlay mark 16 with respect to other features on the layer.

Figure 7:
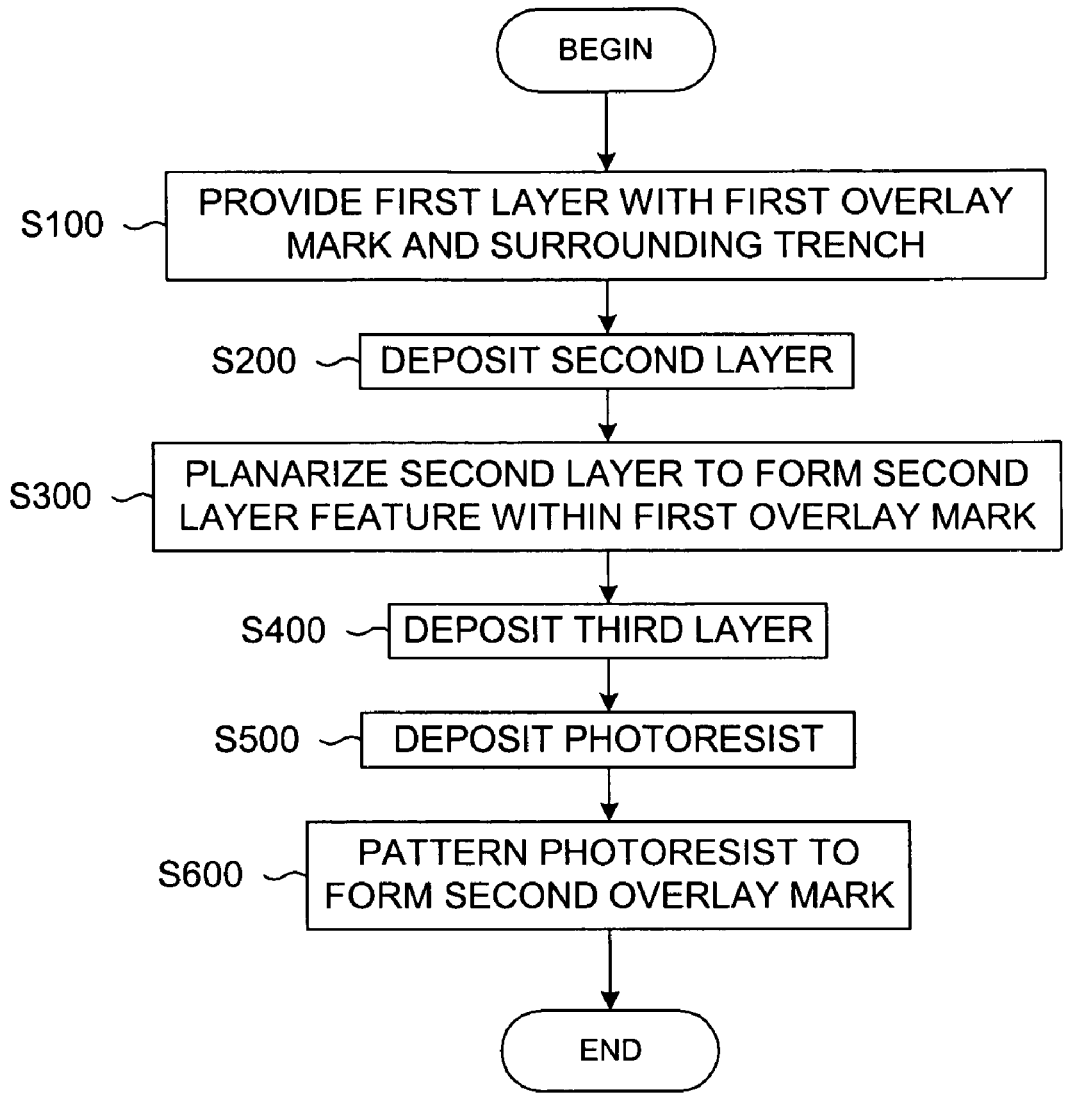
FIG. 7 is a flowchart of a method of fabricating an integrated circuit structure, in accordance with an exemplary embodiment of the present invention.

FIG. 7 is a flowchart of a method of fabricating an integrated circuit structure, in accordance with an exemplary embodiment of the present invention. At a first step S100, a first layer 14 is provided as illustrated in FIGS. 3 and 4. The first layer 14 has an overlay mark 18 and a trench 24. The trench 24 is located at a distance D from the first overlay mark 18 and surrounds the first overlay mark 18. The first step S100 of providing a first layer 14 having a first overlay mark 18 and a trench 24 includes a step of depositing an inter-layer dielectric and patterning the inter-layer dielectric. At a second step S200 a second layer 22 (FIG. 5) is deposited onto the first layer 14, and at a third step S300 the second layer 22 is planarized (FIG. 6A or 6B) to generate a second layer feature within the first overlay mark 18. The depositing of the second layer 22 onto the first layer 14 can comprise depositing a second material, which may comprise, for example, tungsten, onto the first layer 14. The depositing of a second material onto the first layer 14 can thus include depositing a metal such as tungsten onto the first layer 14, and then planarizing the metal to form the second layer feature within the first overlay mark 18. The planarizing of the second layer 22 may comprise a step of etching back the second layer 22 (FIG. 6B) or may include a step of performing CMP on the second layer 22 (FIG. 6A).

At a fourth step S400, a third layer 33 (FIG. 2) is provided onto the first layer 14 and onto the second layer 22. Photoresist 19 (FIG. 2) is then deposited at step S500. The photoresist 19 is patterned at step S600 to form a second overlay mark 16.

In alternate embodiments, trenches may be formed around various other alignment structures to relieve compressive and/or expansive stress caused by differences in the coefficients of expansion of the various layers and structures on a semiconductor device.

In view of the foregoing, it will be understood by those skilled in the art that the methods of the present invention can facilitate formation of an integrated circuit alignment structure. The above-described embodiments have been provided by way of example, and the present invention is not limited to these examples. Multiple variations and modification to the disclosed embodiments will occur, to the extent not mutually exclusive, to those skilled in the art upon consideration of the foregoing description. For example, the first overlay mark 18 may be raised (a "reverse trench"), or the trench 24 could comprise a second overlay mark in some embodiments. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. An integrated circuit structure, comprising:
    a first layer having a first overlay mark and a trench that surrounds the first overlay mark;
    a second layer having a second layer feature in proximity to the first overlay mark;
    a third layer disposed over the first layer and the second layer, the third layer being aligned with the first overlay mark; and
    a second overlay mark disposed at a first distance from the first overlay mark and disposed at a second distance from the trench;
    wherein the second distance changes substantially in response to a profile shift relative to a change of the first distance in response to the profile shift, and the third layer remains in physical and electrical contact with the second layer feature despite the profile shift.

2. The integrated circuit structure as set forth in claim 1, wherein the first overlay mark comprises a trench.

3. The integrated circuit structure as set forth in claim 1, wherein the first overlay mark comprises a raised structure.

4. The integrated circuit structure as set forth in claim 1, wherein the second overlay mark is disposed over the third layer.

5. The integrated circuit structure as set forth in claim 1, wherein the second overlay mark comprises a trench.

6. The integrated circuit structure as set forth in claim 1, wherein:
    the first layer comprises an inter-layer dielectric; and
    the trench is photolithographically etched into the inter-layer dielectric.

7. The integrated circuit structure as set forth in claim 1, wherein the second layer feature in proximity to the first overlay mark is a chemical-mechanical polished feature of a second material.

8. The integrated circuit structure as set forth in claim 1, wherein the second layer feature in proximity to the first overlay mark is an etched-back feature of a second material.

9. The integrated circuit structure as set forth in claim 8, wherein both the second material and the third material comprise metals.

10. The integrated circuit structure as set forth in claim 1, wherein the integrated circuit is flexed and manifests the profile shift.

11. The integrated circuit structure as set forth in claim 10, wherein the integrated circuit has a high temperature and is flexed.

12. The integrated circuit structure as set forth in claim 10, wherein the integrated circuit has a low temperature and is flexed.

* * * * *